(12) United States Patent
Panteleev et al.

(10) Patent No.: US 9,331,716 B2
(45) Date of Patent: May 3, 2016

(54) SYSTEMS AND METHODS FOR AREA EFFICIENT DATA ENCODING

(71) Applicant: LSI Corporation, San Jose, CA (US)

(72) Inventors: Pavel A. Panteleev, Moscow (RU); Elyar E. Gasanov, Moscow (RU); Andre P. Sokolov, Moscow (RU); Yuri Shutkin, Moscow (RU); Dmitriy V. Alekseev, Moscow (RU)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/470,873

(22) Filed: Aug. 27, 2014

(65) Prior Publication Data
US 2015/0229331 A1     Aug. 13, 2015

(30) Foreign Application Priority Data

Feb. 10, 2014 (RU) ................................ 2014104571

(51) Int. Cl.
| | |
|---|---|
| *G11B 5/035* | (2006.01) |
| *G11B 5/09* | (2006.01) |
| *H03M 13/11* | (2006.01) |
| *G11B 20/18* | (2006.01) |
| *H03M 13/00* | (2006.01) |

(52) U.S. Cl.
CPC ......... *H03M 13/116* (2013.01); *G11B 20/1833* (2013.01); *H03M 13/1171* (2013.01); *H03M 13/611* (2013.01); *G11B 2020/185* (2013.01)

(58) Field of Classification Search
CPC ...... G11B 20/1009; G11B 5/035; G11B 5/09; G11B 5/012; G11B 5/00; G11B 5/02; G11B 20/1833; G11B 2020/185; H04L 1/0618; H04L 25/0212; H04L 25/025; H04L 25/03159; H04L 1/0059
USPC .............. 360/65, 24, 29, 39, 46, 55; 375/144, 375/350, 230, 295, 296
See application file for complete search history.

(56) References Cited

U.S. PATENT DOCUMENTS

| | | |
|---|---|---|
| 4,553,221 A | 11/1985 | Hyatt |
| 4,805,174 A | 2/1989 | Kubota |
| 5,278,703 A | 1/1994 | Rub |
| 5,278,846 A | 1/1994 | Okayama |
| 5,317,472 A | 5/1994 | Schweitzer, III |
| 5,325,402 A | 6/1994 | Ushirokawa |
| 5,351,274 A | 9/1994 | Chennakeshu |
| 5,392,299 A | 2/1995 | Rhines |
| 5,406,593 A | 4/1995 | Chennakeshu |
| 5,417,500 A | 5/1995 | Martinie |

(Continued)

FOREIGN PATENT DOCUMENTS

| | | |
|---|---|---|
| JP | 2001/319433 A | 11/2001 |
| WO | WO 2010/059264 A1 | 5/2010 |
| WO | WO 2010/126482 A1 | 11/2010 |

OTHER PUBLICATIONS

Casado et al., Multiple-rate low- density parity-check codes with constant blocklength, IEEE Transations on communications, Jan. 2009, vol. 57, pp. 75-83.

(Continued)

*Primary Examiner* — Nabil Hindi (57) ABSTRACT

The present inventions are related to systems and methods for data processing, and more particularly to systems and methods for data encoding.

20 Claims, 4 Drawing Sheets

(56) References Cited

U.S. PATENT DOCUMENTS

| | | |
|---|---|---|
| 5,450,253 A | 9/1995 | Seki |
| 5,513,192 A | 4/1996 | Janku |
| 5,523,903 A | 6/1996 | Hetzler |
| 5,550,810 A | 8/1996 | Monogioudis |
| 5,550,870 A | 8/1996 | Blaker |
| 5,612,964 A | 3/1997 | Haraszti |
| 5,696,504 A | 12/1997 | Oliveros |
| 5,710,784 A | 1/1998 | Kindred |
| 5,717,706 A | 2/1998 | Ikeda |
| 5,719,871 A | 2/1998 | Helm |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccallister |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,175,588 B1 | 1/2001 | Visotsky |
| 6,216,249 B1 | 4/2001 | Bliss |
| 6,216,251 B1 | 4/2001 | McGinn |
| 6,266,795 B1 | 7/2001 | Wei |
| 6,317,472 B1 | 11/2001 | Choi |
| 6,351,832 B1 | 2/2002 | Wei |
| 6,377,610 B1 | 4/2002 | Hagenauer |
| 6,381,726 B1 | 4/2002 | Weng |
| 6,393,074 B1 | 5/2002 | Mandyam |
| 6,412,088 B1 | 6/2002 | Patapoutian et al. |
| 6,473,878 B1 | 10/2002 | Wei |
| 6,535,553 B1 | 3/2003 | Limberg et al. |
| 6,625,775 B1 | 9/2003 | Kim |
| 6,643,814 B1 | 11/2003 | Cideciyan et al. |
| 6,697,441 B1 | 2/2004 | Bottomley |
| 6,747,827 B1 | 6/2004 | Bassett et al. |
| 6,748,034 B2 | 6/2004 | Hattori et al. |
| 6,757,862 B1 | 6/2004 | Marianetti, II |
| 6,785,863 B2 | 8/2004 | Blankenship et al. |
| 6,807,238 B1 | 10/2004 | Rhee |
| 6,810,502 B2 | 10/2004 | Eidson |
| 6,839,774 B1 | 1/2005 | Ahn et al. |
| 6,948,113 B1 | 9/2005 | Shaver |
| 6,970,511 B1 | 11/2005 | Barnette |
| 6,975,692 B2 | 12/2005 | Razzell |
| 6,986,098 B2 | 1/2006 | Poeppelman |
| 7,035,327 B2 | 4/2006 | Nakajima et al. |
| 7,047,474 B2 | 5/2006 | Rhee |
| 7,058,853 B1 | 6/2006 | Kavanappillil et al. |
| 7,058,873 B2 | 6/2006 | Song et al. |
| 7,073,118 B2 | 7/2006 | Greenberg |
| 7,093,179 B2 | 8/2006 | Shea |
| 7,117,427 B2 | 10/2006 | Ophir |
| 7,130,875 B2 | 10/2006 | Abe |
| 7,133,228 B2 | 11/2006 | Fung |
| 7,136,244 B1 | 11/2006 | Rothberg |
| 7,149,239 B2 * | 12/2006 | Hudson .................. 375/144 |
| 7,184,486 B1 | 2/2007 | Wu |
| 7,191,378 B2 | 3/2007 | Eroz |
| 7,203,887 B2 | 4/2007 | Eroz |
| 7,230,550 B1 | 6/2007 | Mittal |
| 7,237,181 B2 | 6/2007 | Richardson |
| 7,308,061 B1 | 12/2007 | Huang |
| 7,310,768 B2 | 12/2007 | Eidson |
| 7,313,750 B1 | 12/2007 | Feng |
| 7,370,258 B2 | 5/2008 | Iancu |
| 7,415,651 B2 | 8/2008 | Argon |
| 7,499,490 B2 * | 3/2009 | Divsalar et al. .......... 375/240 |
| 7,502,189 B2 | 3/2009 | Sawaguchi |
| 7,523,375 B2 | 4/2009 | Spencer |
| 7,587,657 B2 | 9/2009 | Haratsch |
| 7,590,168 B2 | 9/2009 | Raghavan |
| 7,596,196 B1 | 9/2009 | Liu et al. |
| 7,646,829 B2 | 1/2010 | Ashley |
| 7,702,986 B2 | 4/2010 | Bjerke |
| 7,738,202 B1 | 6/2010 | Zheng |
| 7,752,523 B1 | 7/2010 | Chaichanavong |
| 7,779,325 B2 | 8/2010 | Song |
| 7,802,172 B2 | 9/2010 | Vila Casado |
| 7,913,149 B2 | 3/2011 | Gribok |
| 7,952,824 B2 | 5/2011 | Dziak |
| 7,957,251 B2 | 6/2011 | Ratnakar Aravind |
| 7,958,425 B2 | 6/2011 | Chugg |
| 7,996,746 B2 | 8/2011 | Livshitz |
| 8,018,360 B2 | 9/2011 | Nayak |
| 8,020,069 B1 | 9/2011 | Feng |
| 8,020,078 B2 | 9/2011 | Richardson |
| 8,065,598 B1 * | 11/2011 | Gunnam et al. .............. 714/800 |
| 8,095,859 B1 * | 1/2012 | Peterson et al. .............. 714/801 |
| 8,161,361 B1 | 4/2012 | Song et al. |
| 8,201,051 B2 | 6/2012 | Tan |
| 8,219,868 B1 * | 7/2012 | Chaichanavong et al. .... 714/748 |
| 8,225,168 B2 | 7/2012 | Yu et al. |
| 8,237,597 B2 | 8/2012 | Liu |
| 8,255,765 B1 | 8/2012 | Yeo |
| 8,261,171 B2 | 9/2012 | Annampedu |
| 8,276,055 B1 * | 9/2012 | Gunnam et al. .............. 714/801 |
| 8,291,284 B2 | 10/2012 | Savin |
| 8,291,299 B2 | 10/2012 | Li et al. |
| 8,295,001 B2 | 10/2012 | Liu |
| 8,296,637 B1 | 10/2012 | Varnica |
| 8,370,711 B2 | 2/2013 | Alrod |
| 8,381,069 B1 | 2/2013 | Liu |
| 8,413,032 B1 | 4/2013 | Song |
| 8,429,498 B1 | 4/2013 | Anholt |
| 8,443,267 B2 | 5/2013 | Zhong et al. |
| 8,458,555 B2 | 6/2013 | Gunnam |
| 8,464,142 B2 | 6/2013 | Gunnam |
| 8,495,462 B1 | 7/2013 | Liu |
| 8,516,339 B1 | 8/2013 | Lesea |
| 8,527,849 B2 | 9/2013 | Jakab |
| 8,560,900 B1 | 10/2013 | Bellorado |
| 8,611,033 B2 | 12/2013 | Li et al. |
| 8,630,053 B2 | 1/2014 | Yang et al. |
| 2001/0010089 A1 | 7/2001 | Gueguen |
| 2001/0016114 A1 | 8/2001 | Van Gestel et al. |
| 2002/0021519 A1 | 2/2002 | Rae |
| 2002/0067780 A1 | 6/2002 | Razzell |
| 2002/0168033 A1 | 11/2002 | Suzuki |
| 2003/0031236 A1 | 2/2003 | Dahlman |
| 2003/0123364 A1 | 7/2003 | Nakajima et al. |
| 2003/0126527 A1 | 7/2003 | Kim et al. |
| 2003/0138102 A1 | 7/2003 | Kohn et al. |
| 2003/0147168 A1 | 8/2003 | Galbraith et al. |
| 2003/0188252 A1 | 10/2003 | Kim |
| 2004/0042436 A1 | 3/2004 | Terry et al. |
| 2004/0194007 A1 | 9/2004 | Hocevar |
| 2004/0228021 A1 | 11/2004 | Yamazaki |
| 2004/0264284 A1 | 12/2004 | Priborsky et al. |
| 2005/0047514 A1 | 3/2005 | Bolinth |
| 2005/0149842 A1 | 7/2005 | Kyung |
| 2005/0210367 A1 | 9/2005 | Ashikhmin |
| 2005/0243456 A1 | 11/2005 | Mitchell et al. |
| 2006/0002689 A1 | 1/2006 | Yang et al. |
| 2006/0159355 A1 | 7/2006 | Mizuno |
| 2006/0195730 A1 | 8/2006 | Kageyama |
| 2007/0185902 A1 | 8/2007 | Messinger et al. |
| 2007/0297496 A1 | 12/2007 | Park et al. |
| 2008/0037676 A1 | 2/2008 | Kyun et al. |
| 2008/0069373 A1 | 3/2008 | Jiang et al. |
| 2008/0140686 A1 | 6/2008 | Hong |
| 2008/0304558 A1 | 12/2008 | Zhu et al. |
| 2009/0003301 A1 | 1/2009 | Reial |
| 2009/0092174 A1 | 4/2009 | Wang |
| 2009/0106633 A1 | 4/2009 | Fujiwara |
| 2009/0125780 A1 | 5/2009 | Taylor |
| 2009/0132893 A1 | 5/2009 | Miyazaki |
| 2009/0150745 A1 | 6/2009 | Langner et al. |
| 2009/0177852 A1 | 7/2009 | Chen |
| 2009/0185643 A1 | 7/2009 | Fitzpatrick |
| 2009/0216942 A1 | 8/2009 | Yen |
| 2009/0273492 A1 | 11/2009 | Yang et al. |

(56) References Cited

U.S. PATENT DOCUMENTS

| | | |
|---|---|---|
| 2010/0077276 A1 | 3/2010 | Okamura et al. |
| 2010/0088575 A1 | 4/2010 | Sharon et al. |
| 2010/0150252 A1 | 6/2010 | Camp |
| 2010/0172046 A1 | 7/2010 | Liu et al. |
| 2010/0241921 A1 | 9/2010 | Gunnam |
| 2010/0268996 A1 | 10/2010 | Yang |
| 2010/0322048 A1 | 12/2010 | Yang et al. |
| 2010/0325511 A1 | 12/2010 | Oh |
| 2011/0041040 A1 | 2/2011 | Su |
| 2011/0043938 A1 | 2/2011 | Mathew |
| 2011/0066768 A1 | 3/2011 | Brittner |
| 2011/0167227 A1 | 7/2011 | Yang |
| 2011/0258508 A1 | 10/2011 | Ivkovic |
| 2011/0264987 A1 | 10/2011 | Li |
| 2011/0307760 A1 | 12/2011 | Pisek |
| 2011/0320902 A1 | 12/2011 | Gunnam |
| 2012/0020402 A1 | 1/2012 | Ibing |
| 2012/0038998 A1 | 2/2012 | Mathew |
| 2012/0063023 A1 | 3/2012 | Mathew |
| 2012/0079353 A1 | 3/2012 | Liikanen |
| 2012/0124118 A1 | 5/2012 | Ivkovic |
| 2012/0182643 A1 | 7/2012 | Zhang |
| 2012/0185744 A1 | 7/2012 | Varnica |
| 2012/0203986 A1 | 8/2012 | Strasser et al. |
| 2012/0207201 A1 | 8/2012 | Xia |
| 2012/0212849 A1 | 8/2012 | Xu |
| 2012/0236428 A1 | 9/2012 | Xia |
| 2012/0262814 A1 | 10/2012 | Li |
| 2012/0265488 A1 | 10/2012 | Sun |
| 2012/0317462 A1 | 12/2012 | Liu et al. |
| 2013/0024740 A1 | 1/2013 | Xia |
| 2013/0031440 A1 | 1/2013 | Sharon |
| 2013/0120169 A1 | 5/2013 | Li |
| 2013/0194955 A1 | 8/2013 | Chang |
| 2013/0198580 A1 | 8/2013 | Chen |
| 2013/0238955 A1 | 9/2013 | D'Abreu |
| 2013/0254616 A1 | 9/2013 | Yang |
| 2013/0254619 A1 | 9/2013 | Zhang |

OTHER PUBLICATIONS

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Patapoutian et al "Improving Re-Read Strategies by Waveform Averaging" IEEE Transactions on Mag. vol. 37 No. 6, Nov. 2001.

Planjery et al "Finite Alphabet Iterative Decoders, pt 1: Decoding Beyond Beliver Propogation on BSC" 7/12, printed from the internet Apr. 21, 2014 http://arxiv.org/pdf/1207.4800.pd.

Richardson, T "Error Floors of LDPC Codes" Flarion Technologies Bedminster NJ 07921, tjr@flarion.com (not dated).

Shokrollahi "LDPC Codes: An Introduction", Digital Fountain, Inc. (Apr. 2, 2003).

Spagnol et al, "Hardware Implementation of GF(2m) LDPC Decoders", IEEE Transactions on Circuits and Systemssi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/302,119, filed Nov. 22, 2011, Lei Chen, Unpublished.

U.S. Appl. No. 13/227,544, filed Sep. 8, 2011, Shaohua Yang, Unpublished.

U.S. Appl. No. 13/239,683, filed Sep. 22, 2011, Changyou Xu, Unpublished.

U.S. Appl. No. 13/186,234, filed Jul. 19, 2011, Haitao Xia, Unpublished.

U.S. Appl. No. 14/025,104, filed Sep. 12, 2013, Bruce Wilson, Unpublished.

U.S. Appl. No. 13/545,833, filed Jul. 10, 2012, Zhi Bin Li, Unpublished.

U.S. Appl. No. 13/340,974, filed Dec. 30, 2011, Dan Liu, Unpublished.

U.S. Appl. No. 13/445,848, filed Apr. 12, 2012, Bruce Wilson, Unpublished.

U.S. Appl. No. 13/340,951, filed Dec. 30, 2011, Lei Chen, Unpublished.

U.S. Appl. No. 13/369,468, filed Feb. 9, 2012, Zongwang Li, Unpublished.

U.S. Appl. No. 13/283,549, filed Oct. 27, 2011, Wu Chang, Unpublished.

U.S. Appl. No. 13/171,615, filed Jun. 29, 2011, Bradley D. Seago, Unpublished.

U.S. Appl. No. 13/300,078, filed Nov. 18, 2011, Chung-Li Wang, Unpublished.

U.S. Appl. No. 13/305,510, filed Nov. 28, 2011, Lei Chen, Unpublished.

U.S. Appl. No. 13/227,416, filed Sep. 7, 2011, Lei Chen, Unpublished.

U.S. Appl. No. 13/305,551, filed Nov. 28, 2011, Yang Han, Unpublished.

U.S. Appl. No. 13/296,022, filed Nov. 14, 2011, Victor Krachkovsky, Unpublished.

U.S. Appl. No. 13/445,878, filed Apr. 12, 2012, Yu Liao, Unpublished.

U.S. Appl. No. 13/174,537, filed Jun. 30, 2011, Anantha Raman Krishnan, Unpublished.

U.S. Appl. No. 13/174,453, filed Jun. 30, 2011, Johnson Yen, Unpublished.

U.S. Appl. No. 13/269,832, filed Oct. 10, 2011, Haitao Xia, Unpublished.

U.S. Appl. No. 13/213,751, filed Aug. 19, 2011, Fan Zhang, Unpublished.

U.S. Appl. No. 13/180,495, filed Jul. 11, 2011, Chung-Li Wang, Unpublished.

(56) References Cited

OTHER PUBLICATIONS

U.S. Appl. No. 13/853,711, filed Mar. 29, 2013, Shu Li, Unpublished.
U.S. Appl. No. 13/483,105, filed May 30, 2012, Xuebin Wu, Unpublished.
U.S. Appl. No. 13/426,693, filed Mar. 22, 2012, Shaohua Yang, Unpublished.
U.S. Appl. No. 13/284,767, filed Oct. 28, 2011, Fan Zhang, Unpublished.
U.S. Appl. No. 13/746,301, filed Jan. 21, 2013, Shu Li, Unpublished.
U.S. Appl. No. 13/327,279, filed Dec. 15, 2011, Wei Feng, Unpublished.
U.S. Appl. No. 13/766,891, filed Feb. 14, 2013, Shu Li, Unpublished.
U.S. Appl. No. 13/875,357, filed May 2, 2013, Shaohua Yang, Unpublished.
U.S. Appl. No. 13/945,787, filed Jul. 18, 2013, Shu Li, Unpublished.
U.S. Appl. No. 13/945,777, filed Jul. 18, 2013, Shu Li, Unpublished.
U.S. Appl. No. 13/483,100, filed May 30, 2012, Fan Zhang, Unpublished.
U.S. Appl. No. 13/868,779, filed Apr. 23, 2013, Fan Zhang, Unpublished.
U.S. Appl. No. 13/652,012, filed Oct. 15, 2012, Fan Zhang, Unpublished.
U.S. Appl. No. 13/918,510, filed Jun. 14, 2013, Shu Li, Unpublished.
U.S. Appl. No. 13/770,008, filed Feb. 19, 2013, Shaohua Yang, Unpublished.
U.S. Appl. No. 13/912,059, filed Jun. 6, 2013, Fan Zhang, Unpublished.
U.S. Appl. No. 13/954,573, filed Jul. 30, 2013, Kaitlyn T. Nguyen, Unpublished.
U.S. Appl. No. 14/072,604, filed Nov. 5, 2013, Shu Li, Unpublished.
U.S. Appl. No. 14/047,441, filed Oct. 7, 2013, Haitao Xia, Unpublished.
U.S. Appl. No. 14/101,368, filed Dec. 10, 2013, Yequn Zhang, Unpublished.
U.S. Appl. No. 14/047,319, filed Oct. 7, 2013, Shaohua Yang, Unpublished.
U.S. Appl. No. 14/026,722, filed Sep. 13, 2013, Shaohua Yang, Unpublished.
U.S. Appl. No. 13/944,966, filed Jul. 18, 2013, Fan Zhang, Unpublished.
U.S. Appl. No. 13/284,730, filed Oct. 28, 2011, Fan Zhang, Unpublished.
U.S. Appl. No. 13/372,580, filed Feb. 14, 2012, Fan Zhang, Unpublished.
U.S. Appl. No. 13/422,986, filed Mar. 16, 2012, Fan Zhang, Unpublished.
U.S. Appl. No. 13/474,660, filed May 17, 2012, Zongwang Li, Unpublished.
U.S. Appl. No. 13/433,693, filed Mar. 29, 2012, Fan Zhang, Unpublished.
U.S. Appl. No. 13/596,819, filed Aug. 28, 2012, Shaohua Yang, Unpublished.
U.S. Appl. No. 13/596,947, filed Aug. 28, 2012, Fan Zhang, Unpublished.
U.S. Appl. No. 13/766,911, filed Feb. 14, 2013, Shaohua Yang, Unpublished.
U.S. Appl. No. 13/412,520, filed Mar. 5, 2012, Fan Zhang, Unpublished.
U.S. Appl. No. 13/705,407, filed Dec. 5, 2012, Lingyan Sun, Unpublished.
U.S. Appl. No. 13/426,714, filed Mar. 22, 2012, Shaohua Yang, Unpublished.
U.S. Appl. No. 13/316,858, filed Dec. 12, 2011, Zongwang Li, Unpublished.
U.S. Appl. No. 13/989,583, filed Oct. 15, 2012, Shaohua Yang, Unpublished.
U.S. Appl. No. 13/415,326, filed Mar. 8, 2012, Shaohua Yang, Unpublished.
U.S. Appl. No. 13/596,978, filed Aug. 28, 2012, Fan Zhang, Unpublished.
U.S. Appl. No. 13/597,001, filed Aug. 28, 2012, Fan Zhang, Unpublished.
U.S. Appl. No. 13/619,907, filed Sep. 14, 2012, Fan Zhang, Unpublished.
U.S. Appl. No. 13/621,341, filed Sep. 17, 2012, Shaohua Yang, Unpublished.
U.S. Appl. No. 13/316,741, filed Dec. 12, 2011, Yang Han, Unpublished.
U.S. Appl. No. 13/295,150, filed Nov. 14, 2011, Zongwang Li, Unpublished.
U.S. Appl. No. 13/415,430, filed Mar. 8, 2012, Nayak Ratnakar Aravind, Unpublished.
U.S. Appl. No. 13/362,409, filed Jan. 31, 2012, Fan Zhang, Unpublished.
U.S. Appl. No. 13/269,852, filed Oct. 10, 2011, Haitao Xia, Unpublished.
U.S. Appl. No. 13/113,219, filed May 23, 2011, Yang Han, Unpublished.
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. In COFDM System" IEEE Trans. on Consumer Elect., IEEE Service Center, NY, NY vol. 45, No. 3 Aug. 1999.
Xiao, et al "Nested Codes With Multiple Interpretations" retrieved from the Internet URL: http://www.ece.nmsu.edu/~jkliewer/paper/XFKC_CISS06 (retrieved on Dec. 5, 2012).
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 7.
Zhong, "Block-LDPC: A Practical LDPC Coding System Design Approach", IEEE Trans. on Circuits, Regular Papers, vol. 5, No. 4, pp. 766-775, Apr. 2005.
U.S. Appl. No. 13/426,714, filed Mar. 22, 2012, Shaohua Yang.

\* cited by examiner

Fig. 5a

SYSTEMS AND METHODS FOR AREA EFFICIENT DATA ENCODING

CROSS REFERENCE TO RELATED APPLICATIONS

The present application claims priority to Russian Patent App. No. 2014104571 entitled "Systems and Methods for Area Efficient Data Encoding", and filed Feb. 10, 2014 by Panteleev et al. The entirety of the aforementioned patent application is incorporated herein by reference for all purposes.

FIELD OF THE INVENTION

The present inventions are related to systems and methods for data processing, and more particularly to systems and methods for data encoding.

BACKGROUND

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. Encoding may involve vector multiplication by a quasi-cyclic matrices. Such vector multiplication is complex both in terms of circuit design and the area required to implement the circuits. Such significant area requirements increase the costs of encoding devices.

Hence, for at least the aforementioned reasons, there exists a need in the art for advanced systems and methods for data processing.

SUMMARY

The present inventions are related to systems and methods for data processing, and more particularly to systems and methods for data encoding.

Various embodiments of the present invention provide data processing systems that include an encoder circuit. The encoder circuit includes a cyclic convolution circuit and an encoded output circuit. The cyclic convolution circuit is operable to multiply a vector input derived from a user data input by a portion of a circulant matrix to yield a convolved output. The encoded output circuit is operable to generate an encoded data set corresponding to the user data input and based at least in part on the convolved output.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 4b shows one implementation of an area efficient quasi-cyclic matrix multiplication circuit relying on a number of cyclic convolutions that may be used to implement the area efficient encoder circuit of FIG. 4a;

FIG. 5a shows another implementation an area efficient quasi-cyclic matrix multiplication circuit relying on a number of cyclic convolutions that may be used to implement the area efficient encoder circuit of FIG. 4a; and FIG. 5b depicts one implementation of a parallel cyclic convolution circuit that may be used to implement the parallel cyclic convolution circuit of FIG. 5a.

DETAILED DESCRIPTION OF SOME EMBODIMENTS

The present inventions are related to systems and methods for data processing, and more particularly to systems and methods for data encoding.

Various embodiments of the present invention provide data processing systems that include an encoder circuit. The encoder circuit includes one or more area efficient quasi-cyclic matrix multiplication circuit(s). Such quasi-cyclic matrix multiplication circuit(s) are designed as a number of cyclic convolutions. Using such an approach, it is possible to implement a encoder circuit for quasi-cyclic low density parity check (LDPC) codes that is smaller and offering several times higher throughput compared with an encoder circuit relying exclusively on shift registers and/or barrel shifters to perform quasi-cyclic matrix multiplications. In some cases, the quasi-cyclic matrix multiplication circuit(s) designed as a number of cyclic convolutions may use a combination of Winograd and Agarwal-Cooley fast convolution algorithms, though many other fast convolution algorithms can be used as well. Such Winograd and Agarwal-Cooley algorithms are discussed in detail in Richard E. Blahut, "Fast Algorithms for Digital Signal Processing," Addison-Wesley, Reading, Mass. 1985. The entirety of the aforementioned reference is incorporated herein by reference for all purposes.

Most encoding algorithms for quasi-cyclic LDPC codes can be roughly divided into two main categories: generator matrix based (G-based) and parity-check matrix based (H-based). In a G-based encoder a systematic quasi-cyclic generator matrix G=(I|Gp) is used, where Gp is a quasi-cyclic matrix, which is usually dense. The parity bits vector p is obtained by formula p=uGp, where u is a user bits vector. In an H-based encoder we usually represent a quasi-cyclic parity-check matrix of the code as H=(Hu|Hp), where Hu, Hp are its quasi-cyclic sub-matrices corresponding to the user and parity parts of the codeword. Subsequently, the vector $s^T=H_u u^T$ is calculated, and based thereon the parity vector p is determined as a solution of the equation $H_p p^T = s^T$. As it can be seen from the above description both categories of encoders involve a vector by a quasi-cyclic matrix multiplication step. As such, embodiments of the present invention offering improved quasi-cyclic multiplication circuits offer improved encoding.

Various embodiments of the present invention provide data processing systems that include an encoder circuit. The encoder circuit includes a cyclic convolution circuit and an encoded output circuit. The cyclic convolution circuit is operable to multiply a vector input derived from a user data input by a portion of a circulant matrix to yield a convolved output. The encoded output circuit is operable to generate an encoded data set corresponding to the user data input and based at least in part on the convolved output. In some cases, the data processing system is implemented as part of a storage device, or a communication device. In various cases, the data processing system is implemented as part of an integrated circuit.

In some instances of the aforementioned embodiments, the encoded output circuit includes: a vector adder circuit operable to sum instances of the convolved output with instances of a cyclic convolution output to yield a corresponding instance of a vector sum, and a shift register circuit operable to shift instances of the vector sum to yield the instances of the cyclic convolution output. In some cases, the encoded data set generated based at least in part on the cyclic convolution output. In various cases, the number of instances of the vector sum is l, where l corresponds to the number of sub-vectors into which the user data input is divided.

In various instances of the aforementioned embodiments, the cyclic convolution circuit includes: a first cyclic convolution circuit and a second cyclic convolution circuit. In such instances, the first cyclic convolution circuit operates in parallel with the second cyclic convolution circuit, and the first cyclic convolution circuit operates on a first portion of the vector input and the second cyclic convolution circuit operates on a second portion of the vector input. In some cases, the first portion of the vector input is a 3×1 portion of the vector input, and wherein the second portion of the vector input is a 3×4 portion of the vector input. In other cases, the first portion of the vector input is a 3×4 portion of the vector input, and wherein the second portion of the vector input is a 3×8 portion of the vector input.

In one or more instances of the aforementioned embodiments, the systems further include a transformation circuit operable to transform a first number of bits of the user data input into a second number of bits of the vector input. In some such instances, the first number of bits is 128, and the second number of bits is 255. In various such instances, the cyclic convolution circuit includes: a first cyclic convolution circuit, a second cyclic convolution circuit, and a combining circuit. In such instances, the first cyclic convolution circuit operates in parallel with the second cyclic convolution circuit, and the first cyclic convolution circuit operates on a first portion of the vector input and the second cyclic convolution circuit operates on a second portion of the vector input. The combining circuit is operable to combine at least the first sub-output and the second sub-output to yield a non-transformed output. In some cases, the system further includes an inverse transformation circuit operable transform the second number of bits of the non-transformed output to the first number of bits of a cyclic convolution output.

Other embodiments of the present invention provide methods for data encoding that include: receiving a user data input; using a cyclic convolution circuit to multiply a vector input derived from a user data input by a portion of a circulant matrix to yield a convolved output; and generating an encoded data set corresponding to the user data input and based at least in part on the convolved output. In some instances of the aforementioned embodiments, the methods further include transforming a first number of bits of the user data input into a second number of bits to yield the vector input. In some cases, the first number of bits is 128, and the second number of bits is 255.

In one or more instances of the aforementioned embodiments, the cyclic convolution circuit includes: a first cyclic convolution circuit and a second cyclic convolution circuit. The first cyclic convolution circuit operates in parallel with the second cyclic convolution circuit. The first cyclic convolution circuit operates on a first portion of the vector input and the second cyclic convolution circuit operates on a second portion of the vector input. In some cases, the methods further include: adding instances of the convolved output with instances of a cyclic convolution output to yield a corresponding instance of a vector sum; and shifting instances of the vector sum to yield the instances of the cyclic convolution output.

Figure 1:
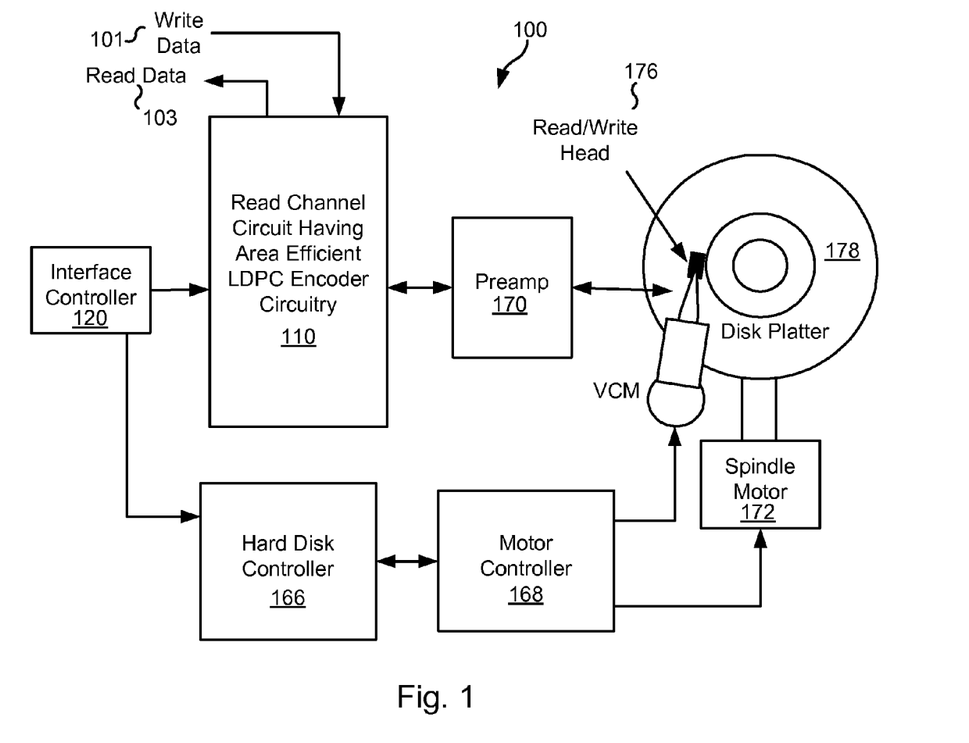
FIG. 1 shows a storage system having area efficient LDPC encoder circuitry in accordance with various embodiments of the present invention.

Turning to FIG. 1, a storage system 100 is shown that includes a read channel 110 having area efficient LDPC encoder circuitry in accordance with one or more embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178, and interacts with a host controller (not shown). The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head 176 is accurately positioned by motor controller 168 over a desired data track on disk platter 178. Motor controller 168 both positions read/write head 176 in relation to disk platter 178 and drives spindle motor 172 by moving read/write head assembly 176 to the proper data track on disk platter 178 under the direction of hard disk controller 166. Spindle motor 172 spins disk platter 178 at a determined spin rate (RPMs). Once read/write head 176 is positioned adjacent the proper data track, magnetic signals representing data on disk platter 178 are sensed by read/write head 176 as disk platter 178 is rotated by spindle motor 172. The sensed magnetic signals are provided as a continuous, minute analog signal representative of the magnetic data on disk platter 178. This minute analog signal is transferred from read/write head 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

In operation, data stored to disk platter 178 is encoded using an area efficient encoder circuit to yield an encoded data set. The encoded data set is then written to disk platter 178, and later accessed from disk platter and decoded using a decoder circuit. In some cases, the area efficient encoder circuit may be implemented to include quasi-cyclic matrix multiplication circuit(s) designed as a number of cyclic convolutions such as that discussed below in relation to FIGS. 4b-4c. In particular cases, the area efficient encoder circuit may be implemented to include quasi-cyclic matrix multiplication circuit(s) that are designed to use a combination of Winograd and Agarwal-Cooley fast convolution algorithms such as one described below in relation to FIGS. 5a-5b. The area efficient encoder circuit may operate similar to that discussed below in relation to FIG. 6.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platter 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
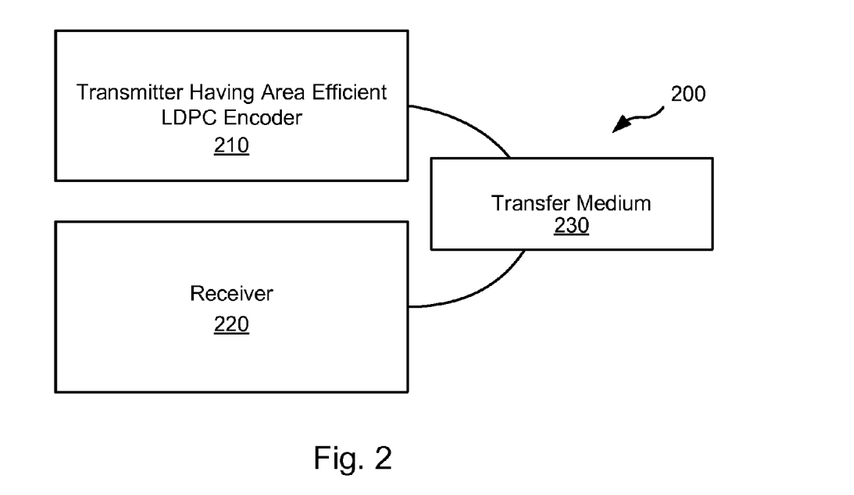
FIG. 2 shows a data transmission device including a transmitter having area efficient LDPC encoder circuitry in accordance with various embodiments of the present invention.

Turning to FIG. 2, a data transmission system 200 including a transmitter 210 having area efficient LDPC encoder circuitry in accordance with one or more embodiments of the present invention. Transmitter 210 transmits encoded data via a transfer medium 230. Transfer medium 230 may be a wired or wireless transfer medium. Based upon the disclosure provided herein, one of ordinary skill in the art will recognize a variety of transfer mediums that may be used in relation to different embodiments of the present invention. The encoded data is received from transfer medium 230 by receiver 220. In operation, transmitter encodes user data using an area efficient encoder circuit to yield an encoded data set. In some cases, the area efficient encoder circuit may be implemented to include quasi-cyclic matrix multiplication circuit(s) designed as a number of cyclic convolutions such as that discussed below in relation to FIGS. 4b-4c. In particular cases, the area efficient encoder circuit may be implemented to include quasi-cyclic matrix multiplication circuit(s) that are designed to use a combination of Winograd and Agarwal-Cooley fast convolution algorithms such as one described below in relation to FIGS. 5a-5b. The area efficient encoder circuit may operate similar to that discussed below in relation to FIG. 6.

Figure 3:
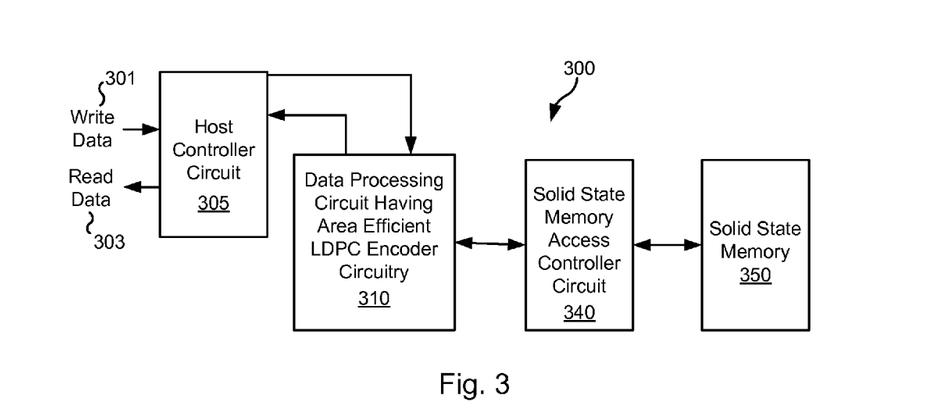
FIG. 3 shows a solid state memory circuit including a data processing circuit having area efficient LDPC encoder circuitry in accordance with some embodiments of the present invention.

Turning to FIG. 3, another storage system 300 is shown that includes a data processing circuit 310 having area efficient LDPC encoder circuitry in accordance with one or more embodiments of the present invention. A host controller circuit 305 receives data to be stored (i.e., write data 301). Solid state memory access controller circuit 340 may be any circuit known in the art that is capable of controlling access to and from a solid state memory 350. Solid state memory access controller circuit 340 encodes a received data set to yield an encoded data set. The encoding is done using an area efficient LDPC encoder circuit, and results in an encoded data set that is stored to solid state memory 350. Solid state memory 350 may be any solid state memory known in the art. In some embodiments of the present invention, solid state memory 350 is a flash memory. In some cases, the area efficient encoder circuit may be implemented to include quasi-cyclic matrix multiplication circuit(s) designed as a number of cyclic convolutions such as that discussed below in relation to FIGS. 4b-4c. In particular cases, the area efficient encoder circuit may be implemented to include quasi-cyclic matrix multiplication circuit(s) that are designed to use a combination of Winograd and Agarwal-Cooley fast convolution algorithms such as one described below in relation to FIGS. 5a-5b. The area efficient encoder circuit may operate similar to that discussed below in relation to FIG. 6.

Figure 4A:
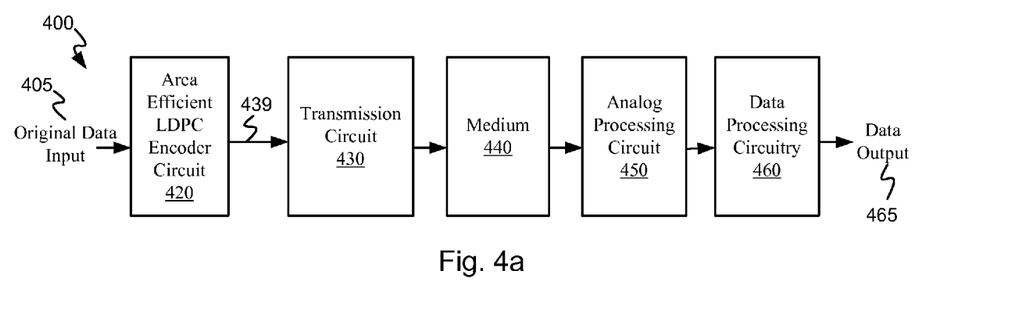
FIG. 4a shows a processing system including an area efficient LDPC encoder circuit in accordance with some embodiments of the present invention.

Turning to FIG. 4a, a data processing system 400 is shown that includes an area efficient LDPC encoder circuit 420 in accordance with some embodiments of the present invention. Data processing system 400 includes area efficient LDPC encoder circuit 420 that applies data encoding algorithm using matrix multiplication implemented as a number of cyclic convolutions. Area efficient LDPC encoder circuit 420 applies the encoding algorithm to an original data input 405 to yield an encoded output 439. Application of the encoding algorithm includes performing a number of vector multiplications by quasi-cyclic matrices implemented as a number of cyclic convolutions. The vector multiplications by quasi-cyclic matrices may be implemented similar to that discussed below in relation to FIGS. 4b-4c.

Encoded output 439 is provided to a transmission circuit 430 that is operable to transmit the encoded data to a recipient via a medium 440. Transmission circuit 430 may be any circuit known in the art that is capable of transferring encoded output 439 via medium 440. Thus, for example, where data processing circuit 400 is part of a hard disk drive, transmission circuit 430 may include a read/write head assembly that converts an electrical signal into a series of magnetic signals appropriate for writing to a storage medium. Alternatively, where data processing circuit 400 is part of a wireless communication system, transmission circuit 430 may include a wireless transmitter that converts an electrical signal into a radio frequency signal appropriate for transmission via a wireless transmission medium. Transmission circuit 430 provides a transmission output to medium 440. Medium 440 provides a transmitted input that is the transmission output augmented with one or more errors introduced by the transference across medium 440.

Of note, original data input 405 may be any data set that is to be transmitted. For example, where data processing system 400 is a hard disk drive, original data input 405 may be a data set that is destined for storage on a storage medium. In such cases, a medium 440 of data processing system 400 is a storage medium. As another example, where data processing system 400 is a communication system, original data input 405 may be a data set that is destined to be transferred to a receiver via a transfer medium. Such transfer mediums may be, but are not limited to, wired or wireless transfer mediums. In such cases, a medium 440 of data processing system 400 is a transfer medium.

Data processing circuit 400 includes an analog processing circuit 450 that applies one or more analog functions to the transmitted input. Such analog functions may include, but are not limited to, amplification and filtering. Based upon the disclosure provided herein, one of ordinary skill in the art will recognize a variety of pre-processing circuitry that may be used in relation to different embodiments of the present invention. In addition, analog processing circuit 450 converts the processed signal into a series of corresponding digital samples. Data processing circuitry 460 applies data detection and/or data decoding algorithms to the series of digital samples to yield a data output 465. Based upon the disclosure provided herein, one of ordinary skill in the art will recognize a variety of data processing circuitry that may be used to recover original data input from the series of digital samples.

As background to understanding an area efficient quasi-cyclic matrix multiplication circuit used to implement the area efficient encoder circuit 420, an l×l matrix over GF(q) is called a circulant if it has the following form:

$$\begin{pmatrix} a_0 & a_{l-1} & \cdots & a_1 \\ a_1 & a_0 & \cdots & a_2 \\ \vdots & \vdots & \ddots & \vdots \\ a_{l-1} & a_{l-2} & \cdots & a_0 \end{pmatrix}.$$

Such a circulant matrix can be uniquely represented by its first column $(a_0, a_1, \ldots, a_{l-1})^T$, and it can be seen that a vector can be re-written by a circulant matrix multiplication in the following way:

$$\begin{bmatrix} c_0 \\ c_1 \\ \vdots \\ c_{l-1} \end{bmatrix} = \begin{pmatrix} a_0 & a_{l-1} & \cdots & a_1 \\ a_1 & a_0 & \cdots & a_2 \\ \vdots & \vdots & \ddots & \vdots \\ a_{l-1} & a_{l-2} & \cdots & a_0 \end{pmatrix} \begin{bmatrix} b_0 \\ b_1 \\ \vdots \\ b_{l-1} \end{bmatrix}.$$

The aforementioned multiplication may be represented in the following way:

$$c_i = \sum_{j=0}^{l-1} a_j b_{(i-j) \bmod n}.$$

The vector $c = (c_0, \ldots, c_{l-1})^T$ is referred to herein as a cyclic convolution of the vectors $a = (a_0, \ldots, a_{l-1})^T$ and $b = (b_0, \ldots, b_{l-1})^T$, and for simplicity is denoted as $a*b$.

A quasi-circulant matrix may be represented as follows:

$$A = \begin{pmatrix} A_{11} & \cdots & A_{n1} \\ \vdots & \ddots & \vdots \\ A_{m1} & \cdots & A_{mn} \end{pmatrix}.$$

where each block $A_{ij}$, i=1 to m, j=1 to n, is an l×l circulant matrix over a finite field GF(q). Using a column vector $u = (u_1, \ldots, u_n)^T$, where sub-vectors $u_1, \ldots, u_n$ are of length l, multiplying u by the aforementioned quasi-circulant matrix yields:

$$\begin{bmatrix} v_1 \\ \vdots \\ v_m \end{bmatrix} = \begin{pmatrix} A_{11} & \cdots & A_{n1} \\ \vdots & \ddots & \vdots \\ A_{m1} & \cdots & A_{mn} \end{pmatrix} \begin{bmatrix} u_1 \\ \vdots \\ u_n \end{bmatrix},$$

where each sub-vector $v_i$ of length l is given by the following formula:

$$v_i = A_{i1} u_1 + \ldots + A_{in} u_n; \text{ for } i=1 \text{ to } m.$$

Applying cyclic convolution, the preceding formula for each sub-vector $v_i$ of length l may be re-written as:

$$v_i = a_{i1} * u_1 + \ldots + a_{in} * u_n; \text{ for } i=1 \text{ to } m.$$

where $a_{ij}$ is the first column of the aforementioned circulant matrix $A_{ij}$;
for i=1 to m, and j=1 to n. Thus, quasi-cyclic multiplication can be obtained by performing m×n cyclic convolutions and m×(n−1) vector additions over GF(q).

Figure 4B:
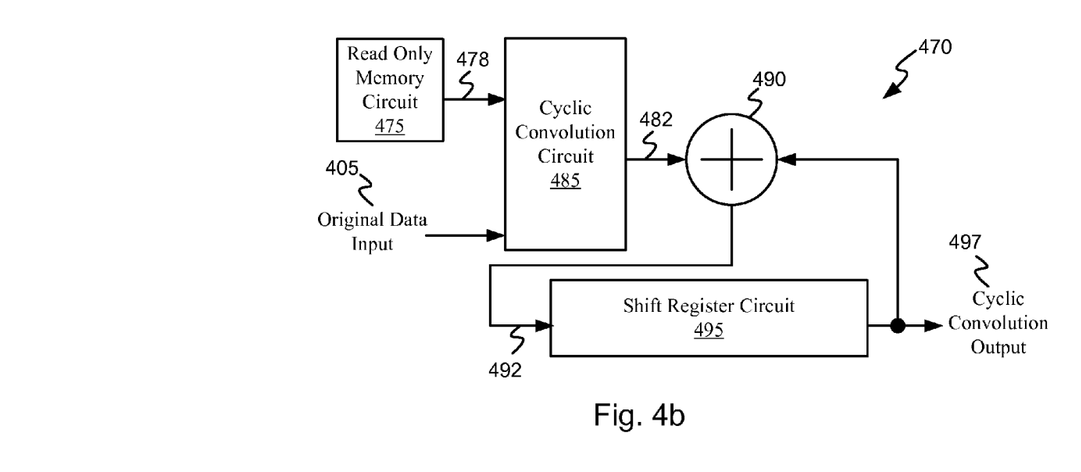

Turning to FIG. 4b, an implementation of an area efficient quasi-cyclic matrix multiplication circuit 470 relying on a number of cyclic convolutions is shown that may be used to implement the matrix multiplication circuitry of area efficient encoder circuit 420 of FIG. 4a. Area efficient quasi-cyclic matrix multiplication circuit 470 includes a read only memory circuit 475 pre-programmed to include the first columns of circulant matrices 478 (i.e., the aforementioned $A_{ij}$).

Original data input 405 (i.e., $u_j$) and the first columns of circulant matrices 478 (i.e., $a_{ij}$) are provided to a cyclic convolution circuit 485 that applies cyclic convolution to the received inputs to yield a convolved output 482 (i.e., $a_{ij} * u_j$). Convolved output 482 is provided to a vector addition circuit 490 that is operable to calculate the sum of two vectors of length l over GF(q). In some embodiments of the present invention, vector addition circuit 490 is implemented using XOR gates as is known in the art. In particular, vector addition circuit 490 calculates the sum of convolved output 482 and an accumulated cyclic convolution output 497 over a length l. A resulting vector sum 492 is stored to a shift register circuit 495 where it is shifted over the length l with the final shift yielding the final value of cyclic convolution output 497. Initially, all of the values in shift register circuit 495 are zeros. The final value of cyclic convolution output 497 may be represented by the following equation:

cyclic convolution output 497=$a_{i1}*u_1+ \ldots +a_{in}*u_n$;
for $i=1$ to $m$.

The approach used in area efficient quasi-cyclic matrix multiplication circuit 470 operates over m×n clock cycles plus the delay of cyclic convolution circuit 485. Original data input 405 ($u_j$) and the first columns of circulant matrices 478 ($a_{ij}$) should be in the following order:

$$\begin{array}{c|ccccccccc} u_j & u_1 & u_1 & \ldots & u_1 & u_2 & u_2 & \ldots & u_2 & u_3 & \ldots \\ a_{ij} & a_{11} & a_{21} & \ldots & a_{m1} & a_{12} & a_{22} & \ldots & a_{m2} & a_{13} & \ldots \end{array}$$

Figure 4C:
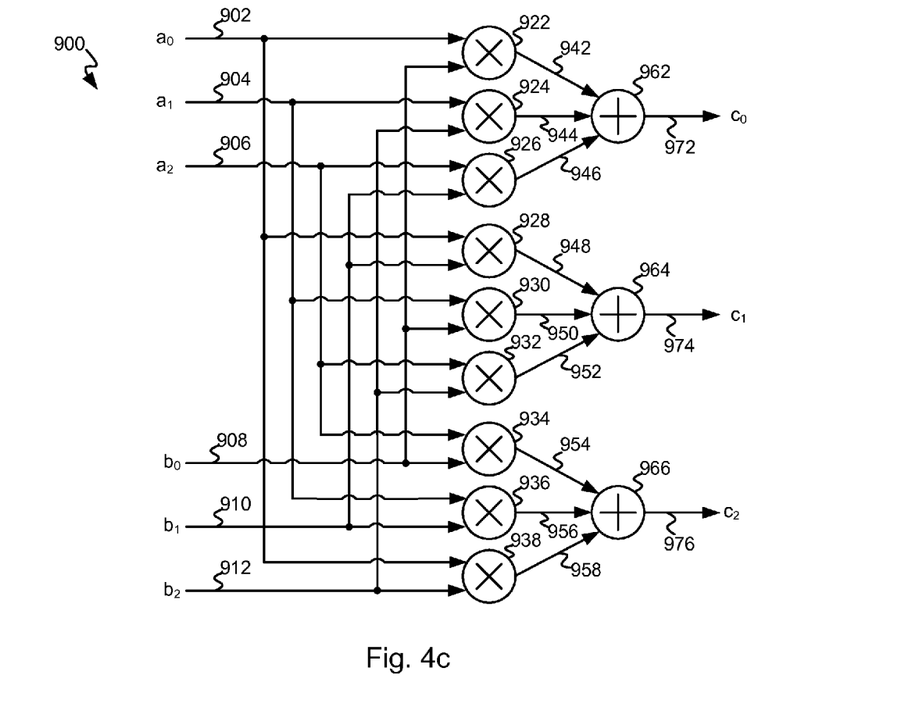
FIG. 4c depicts an cyclic convolution circuit that may be used to implement the area efficient quasi-cyclic matrix multiplication circuit of FIG. 4b.

Turning to FIG. 4c, one implementation of a cyclic convolution circuit 900 for a length l of three that may be used to implement area efficient quasi-cyclic matrix multiplication circuit 470 of FIG. 4b. As shown, cyclic convolution circuit 900 receives two vectors each of length three (i.e., 'a' and 'b'). Vector 'a' includes a vector element 902 ($a_0$), a vector element 904 ($a_1$), and a vector element 906 ($a_2$). Vector 'b' includes a vector element 908 ($b_0$), a vector element 910 ($b_1$), and a vector element 912 ($b_2$). Where cyclic convolution circuit 900 is used in relation to area efficient quasi-cyclic matrix multiplication circuit 470, vector 'a' corresponds to original data input 405 (i.e., $u_j$), and vector 'b' corresponds to the first columns of circulant matrices 478 (i.e., $a_{ij}$).

Vector element 902 is provided to a multiplier circuit 922 where it is multiplied by vector element 908 to yield a product 942; vector element 902 is provided to a multiplier circuit 928 where it is multiplied by vector element 910 to yield a product 948; and vector element 902 is provided to a multiplier circuit 938 where it is multiplied by vector element 912 to yield a product 958. Vector element 904 is provided to a multiplier circuit 924 where it is multiplied by vector element 912 to yield a product 944; vector element 904 is provided to a multiplier circuit 930 where it is multiplied by vector element 908 to yield a product 950; and vector element 904 is provided to a multiplier circuit 936 where it is multiplied by vector element 910 to yield a product 956. Vector element 906 is provided to a multiplier circuit 926 where it is multiplied by vector element 910 to yield a product 946; vector element 906 is provided to a multiplier circuit 932 where it is multiplied by vector element 912 to yield a product 952; and vector element 906 is provided to a multiplier circuit 934 where it is multiplied by vector element 908 to yield a product 954.

Figure 5A:
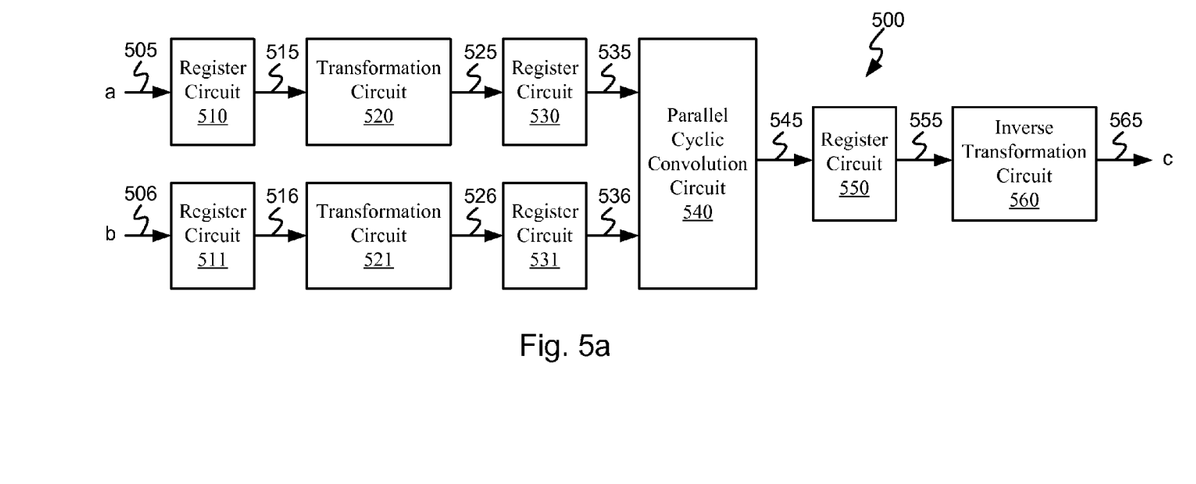

Product 942, product 944, and product 946 are provided to an adder circuit 962 where they are summed to yield a vector component 972 ($c_0$). Product 948, product 950, and product 952 are provided to an adder circuit 964 where they are summed to yield a vector component 974 ($c_1$). Product 954, product 956, and product 958 are provided to an adder circuit 966 where they are summed to yield a vector component 976 ($c_2$).

Where the length l of convolved output 482 is small, implementation of area efficient quasi-cyclic matrix multiplication circuit 470 using blocks similar to that discussed in FIG. 4c may be acceptable. However, where the length l of convolved output 482 becomes larger, cyclic convolution circuit 485 may be implemented using one or more fast cyclic convolution algorithms known in the art. Turning to FIG. 5a, another implementation an area efficient quasi-cyclic matrix multiplication circuit 500 is shown that relies on a number of cyclic convolutions that may be used to implement the area efficient encoder circuit 420 of FIG. 4a. Area efficient quasi-cyclic matrix multiplication circuit 500 utilizes a parallel cyclic convolution circuit 540 implemented using a combination of Winograd and Agarwal-Cooley fast convolution algorithms to operate on a binary field GF(2).

Area efficient quasi-cyclic matrix multiplication circuit 500 includes a register circuit 510 that holds a number of bits of an original data input 505 in parallel. In one embodiment of the present invention, the number of bits is one-hundred twenty-eight (128) bits. Based upon the disclosure provided herein, one of ordinary skill in the art will recognize other bit widths that may be used in relation to different embodiments of the present invention. The registered data is accessed in parallel from register circuit 510 as a registered vector 515. Registered vector 515 is provided to a transformation circuit 520 where the number of bits in registered vector 515 are increased to yield a transformed vector 525. The operation of transformation circuit 520 is more fully discussed below. In one embodiment of the present invention, the number of bits in transformed vector 525 is two-hundred fifty-five (255) bits. Based upon the disclosure provided herein, one of ordinary skill in the art will recognize other bit widths that may be used in relation to different embodiments of the present invention. Transformed vector 525 is stored to a register circuit 530 that provides the registered data as a registered vector 535 (a').

Similarly, area efficient quasi-cyclic matrix multiplication circuit 500 includes a register circuit 511 that holds a number of bits of an original data input 506 in parallel. In one embodiment of the present invention, the number of bits is one-hundred twenty-eight (128) bits. Based upon the disclosure provided herein, one of ordinary skill in the art will recognize other bit widths that may be used in relation to different embodiments of the present invention. The registered data is accessed in parallel from register circuit 511 as a registered vector 516. Registered vector 516 is provided to a transformation circuit 521 where the number of bits in registered vector 516 are increased to yield a transformed vector 526. The operation of transformation circuit 521 is more fully discussed below. In one embodiment of the present invention, the number of bits in transformed vector 526 is two-hundred fifty-five (255) bits. Based upon the disclosure provided herein, one of ordinary skill in the art will recognize other bit widths that may be used in relation to different embodiments of the present invention. Transformed vector 526 is stored to a register circuit 531 that provides the registered data as a registered vector 536 (b').

Assuming the width of registered vector 535 and registered vector 536 is 255, parallel cyclic convolution circuit 540 that splits each of registered vector 535 and registered vector 536 into chunks ($s_0^{(1)}, \ldots, s_0^{(12)}, s_1^{(1)}, \ldots, s_1^{(12)}, s_2^{(1)}, \ldots, s_2^{(12)}$), where 1-bit chunks $s_0^{(1)}, s_1^{(1)}, s_2^{(1)}$ are considered as elements of GF(2); 4-bit chunks $s_0^{(2)}, s_1^{(2)}, s_2^{(2)}$ are considered as elements of GF($2^4$) ; 8-bit chunks $s_0^{(3)}, s_1^{(3)}, s_2^{3}, \ldots, s_0^{(12)}, s_1^{(12)}, s_2^{(12)}$ are considered as elements of GF($2^8$).

Figure 5B:
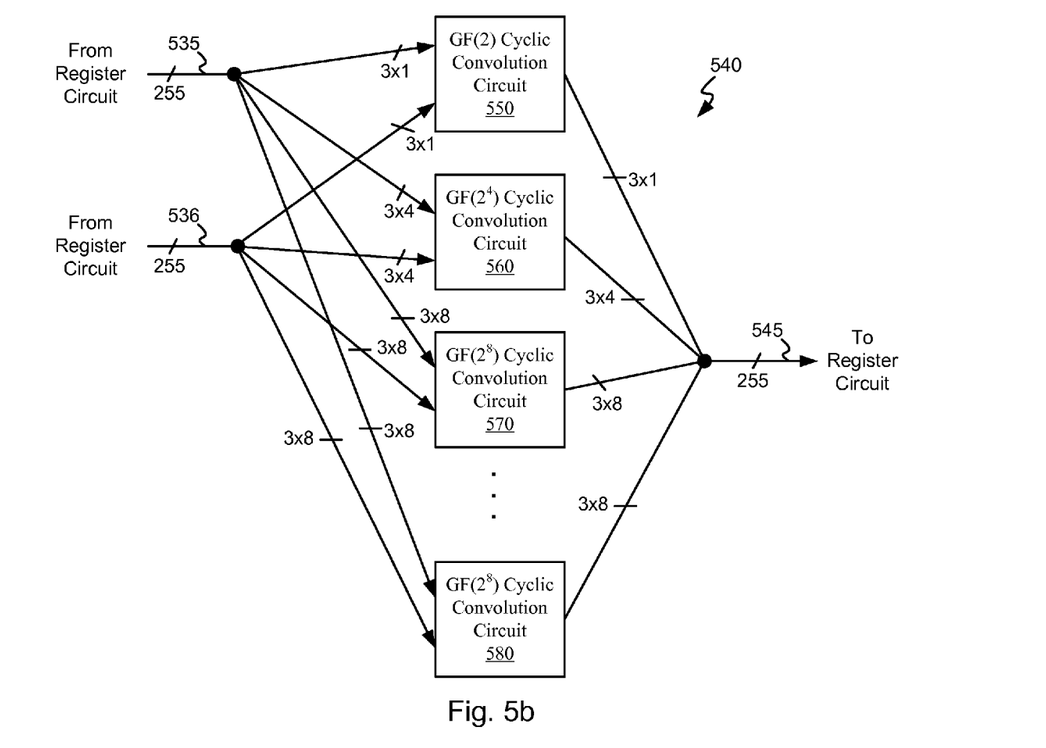

The aforementioned chunks are distributed between twelve cyclic convolution blocks 550, 560, 570, 580 over the finite fields GF(2), GF($2^4$) , and GF($2^8$) as shown on FIG. 5b. The primitive polynomial for GF($2^4$) is $x^4+x+1$, the primitive polynomial for GF($2^8$) is $x^8+x^4+x^3+x+1$. Turning to FIG. 5b, the ith cyclic convolution block calculates the cyclic convolution of the chunks $a_0^{(i)}, a_1^{(i)}, a_2^{(i)}$ of registered vector 535 (a')

and the chunks $b_0^{(i)}$, $b_1^{(i)}$, $b_2^{(i)}$ of registered vector 536 (b'). Each of the twelve cyclic convolution blocks (represented by blocks 550, 560, 570, 580) calculates cyclic convolution of length three (3) and can be implemented similar to cyclic convolution circuit 900 discussed above in relation to FIG. 4c. In particular, a 3×1 block $a_0^{(1)}$, $a_1^{(1)}$, $a_2^{(1)}$ is convolved with a 3×1 block $b_0^{(1)}$, $b_1^{(1)}$, $b_2^{(1)}$ by block 550 to yield a 3×1 convolved output $c_0^{(1)}$, $c_1^{(1)}$, $c_2^{(1)}$. A 3×4 $a_0^{(2)}$, $a_1^{(2)}$, $a_2^{(2)}$ is convolved with a 3×4 block $b_0^{(2)}$, $b_1^{(2)}$, $b_2^{(2)}$ by block 560 to yield a 3×4 convolved output $c_0^{(2)}$, $c_1^{(2)}$, $c_2^{(2)}$. A 3×8 block $a_0^{(3)}$, $a_1^{(3)}$, $a_2^{(3)}$ is convolved with a 3×8 block $b_0^{(3)}$, $b_1^{(3)}$, $b_2^{(3)}$ by block 570 to yield a 3×8 convolved output $c_0^{(3)}$, $c_1^{(3)}$, $c_2^{(3)}$. A 3×8 block $a_0^{(12)}$, $a_1^{(12)}$, $a_2^{(12)}$ is convolved with a 3×8 block $b_0^{(12)}$, $b_1^{(12)}$, $b_2^{(12)}$ by block 580 to yield a 3×8 convolved output $c_0^{(12)}$, $c_1^{(12)}$, $c_2^{(12)}$. The 3×8 blocks $a_0^{(4..11)}$, $a_1^{(4..11)}$, $a_2^{(4..11)}$ and $b_0^{(4..11)}$, $b_1^{(4..11)}$, $b_2^{(4..11)}$ are convolved by respective blocks (not shown) to yield respective 3×8 convolved outputs $c_0^{(4..11)}$, $c_1^{(4..11)}$, $c_2^{(4..11)}$. Parallel cyclic convolution circuit 540 merges the resulting convolved outputs $c_0^{(1..12)}$, $c_1^{(1..12)}$, $c_2^{(1..12)}$ to yield a cyclic output 545 (c').

Returning to FIG. 5a and assuming the width of register vector 535 and register vector 536 is 255, transformation circuit 520 and transformation circuit 521 each multiply their respective inputs considered as vectors over GF(2) by a binary matrix (T). Cyclic output 545 is provided to a register circuit 552 which stores the 255-bit vector as a vector output 555. Vector output 555 is provided to an inverse transformation circuit 562 that reverses the transformation applied by transformation circuit 520 and transformation circuit 521. Inverse transformation circuit 560 multiplies vector output 555 over GF(2) by a binary matrix ($T^{-1}$). Such multiplications by transformation circuit 520, transformation circuit 521, and inverse transformation circuit 562 may be implemented using XOR gates as is known in the art.

In order to define the matrices T and $T^{-1}$ the following 3×3 block matrix ($T_F$) with 85 bits per column is defined:

$$\begin{pmatrix} T_{85} & 0 & 0 \\ 0 & T_{85} & 0 \\ 0 & 0 & T_{85} \end{pmatrix},$$

where $T_{85}$ is itself an 85×85 matrix by the following row permutations: for all i=1 to 255 move row number 1+85((i−1)mod3)+(i−1)mod85 to the place number i. The transformation matrix T is then obtained from $T_F$ by removing the last 127 columns. Using the notation indicating that $T_F^{-1}$ is the inverse of $T_F$, and $r_i$ is the ith row of $T_F^{-1}$, then the inverse matrix $T^{-1}$ is obtained as follows:

$$T^{-1} = \begin{pmatrix} r_1 + r_{129} \\ r_2 + r_{130} \\ \vdots \\ r_{127} + r_{255} \\ r_{128} \end{pmatrix}.$$

The aforementioned $T_{85}$ matrix is obtained by factoring the polynomial $x^{85}+1$ to irreducible factors (i.e., primes) over GF(2):

$$x^{85}+1 = f^{(1)}(x) \ldots f^{(12)}(x),$$

where $f^{(1)}(x)=x+1$, $f^{(2)}(x)=x^4+x^3+x^2+1$, $f^{(3)}(x)=x^8+x^7+x^6+x^4+x^2+x+1$, $f^{(4)}(x)=x^8+x^7+x^5+x+1$, $f^{(5)}(x)=x^8+x^7+x^3+x+1$, $f^{(6)}(x)=x^8+x^5+x^4+x^3+1$, $f^{(7)}(x)=x^8+x^5+x^4+x^3+x^2+x+1$, $f^{(8)}(x)=x^8+x^6+x^5+x^4+x^2+x+1$, $f^{(9)}(x)=x^8+x^6+x^5+x^4+x^3+x+1$, $f^{(10)}(x)=x^8+x^7+x^6+x^4+x^3+x^2+1$, $f^{(11)}(x)=x^8+x^7+x^5+x^4+x^3+x^2+1$, and $f^{(12)}(x)=x^8+x^7+x^6+x^5+x^4+x^3+1$.

Let $d_i = \deg f^{(i)}(x)$ for i=1 to 12, $d_i \times 85$ matrix $T_i$ such that its jth column is equal to $(c_0, \ldots, c_{d_i-1})^T$, where:

$c_0 + c_1 x + \ldots + c_{d_i-1} x^{d_i-1} = x^{j-1} \bmod f^{(i)}(x)$; for i=1 to 12, j=1 to 85.

Each irreducible polynomial $f^{(i)}(x)$ defines the finite field $F^{(i)} = GF(2)[x]/(f^{(i)}(x))$ of polynomials over GF(2) modulo $f^{(i)}(x)$. The field $F^{(1)}$ is isomorphic to the field GF(2), the field $F^{(2)}$ is isomorphic to the field GF($2^4$) defined by the irreducible polynomial $x^4+x+1$, the fields $F^{(2)}, \ldots, F^{(12)}$ are isomorphic to the field GF($2^8$) defined by the irreducible polynomial $x^8+x^4+x^3+x+1$. Let $B_i$ be the $d_i \times d_i$ transition matrix from the field $F^{(i)}$ to the corresponding isomorphic field. It means that if a binary column vector a representing an element from the field $F^{(i)}$ then the vector $B_i a$ represents the corresponding element in the isomorphic field. Then the matrix $T_{85}$ can be calculated by the following formula:

$$T_{85} = \begin{pmatrix} B_1 T_1 \\ \vdots \\ B_{12} T_{12} \end{pmatrix}.$$

The resulting matrix $T_{85}$ is as follows:

```
1111111111111111111111111111111111111111111111111111111111111111111111111111111111111
10001100011000110001100011000110001100011000110001100011000110001100011000110001
00011000110001100011000110001100011000110001100011000110001100011000110001100011
00101001010010100101001010010100101001010010100101001010010100101001010010100101
01111011110111101111011110111101111011110111101111011110111101111011110111101111
11110100110110010111010011011001011101001101100101110100110110010111010011011001
0100110101101100101001101101011001010011011010110010100110110101100101001101110010110011001
01011000000110100101100000001101001011000000011010010110000000110100101100000011010
01110011001110000111100110011100001111001100111000011110011001110000111100110011100
00111100001000010001111000010000100011110000100001000111100001000010001111000010
01101100101110100101100101110100101101001011101001011010010111010010110100101111010
00000010111011101000000010111011101000000010111011101000000010111011101000000010111011101
0000010001111000100000010001111000100000010001111000100000010001111000100000010001111000
1101110110100001100000110100010001000111101101011100010010010101111111010011111001
```

-continued

```
01110101110001001001010111111110100111111001110111101101000110000011010010001000111111
01001110000111101010010110010111100011100110101010110001010100010110101101100001000000
010001011010110110000100000010011100001111010100101100101111000111001101010101000101
0011001000011001111001001101101111100000001110100000101001100011011100101000010111011
0100011000001101001000100011111011101011100010010010101111111101001111110011101111011
0101010001011010110110000100000010011100001111010100101100101111000111001101010101100
0010111011001100100001100111100100110110111110000000111010000010100110001101110010100
1011101111100010001001011000001100010110111101110011111100101111111101010010010001110
0110000011000101101111011100111111001011111111010100100100011101011101111100010001001
0001001100110111010000101001110110001100101000001011100000000111110110110010011100110
0000111110110110010011110011000010011001101110100001010011101100011001010000010111000
0111100001110010000000100001101101011010001010100011010101011001110001111010011010010 1
0111010111011111000100010010110000011000101101111011100111111001011111111010100100100
0011111011011001001111001100001001100110111010000101001110110001100101000001011100000
0000111001000000100001101101011010001010100011010101011001110001111010011010010101111
1000111111110001010001111111100010100011111111000101000111111110001010001111111100010
0001111011011110000011110110111100000111101101111000001111011011110000011110110111100
0001010101000011000010101010000110000101010100001100001010101000011000010101010000110
0100110001100101101001100011001011010011000110010110100110001100101101001100011001011
0001000110110001000010001101100010000100011011000100001000110110001000010001101100010
0001111111110001010001111111100010100011111111000101000111111110001010001111111100010 1
0010001001011110100100010010111101001000100101111010010001001011110100100010010111101
0000100011011000100001000110110001000010001101100010000100011011000100001000110110001
1111000101100111100000101110100001010100110111110110110000100011101110110010111110111 1
0101111101111111100010110011110000010111010000101010011011111011011000010001110111011 0
0110010011001101011100001100000000100111010100010000111001110001111110101100011011010 0
0001100000000100111010100010000111001110001111110101100011011010001100100110011010111 0
0010010000011110100101101110010101101010101111001000101000000110100111110011000100101
0001010100110111101101100001000111011101100101111101111111100010110011110000010111010
0001000001110011100011111101011000110110100011001001100110101110000110000000010011101 01
0000001101001111100110001001010010010000011110100101101110010101101010101111001000101
1110110110001011100111110000111111011110100000011101011101100111011100010010101010001
0101000111101101100010111001111100001111110111101000000111010111011001110111000100101
0111010010111100011001100001010010010000110100010101111101010110101100000000101100101 1
0101001001000011010001010111110101011010110000000101100101101110100101111000110011000
0010011110011010100110010011011111111100100011011010011100101000010001000001100011100 0
0001111111011110100000011101011101100111011100010010101010001111011011000101110011111 0
0010000110100010101111101010110101100000000101100101101110100101111000110011000010100 1
0000100010000011000111000001001111001101010011001001101111111110010001101101001110010 1
1011100111010110110010100111101101011110100011011110001110010110001001001011110100110 1
0110101111010001101111000111001011000100100101110100110110111001110101101100101001111
0011001101000011010101011100010111111100100111000000001011010010000001110111011000001
0011010101011100010111111100100111000000001011010010000001110111011000001001100110100
0001000001000111100110001100100010101001010110011111011111010100000110000111110000101
0011101011011001010011111010101110100011011110001110010110001001001011110100110110111
0100000011101110110000010011001101000011010101011100010111111100100111000000001011010
0010100010000100011110011000110010001010100101011001111101111101010000011000011111100
1000000101111011111100001111100111010001101101111000101010100100011101110011011101011
0001011110111111000011111001110100011011011110001010101001000111011100110111010111000
01101100010011111111011001001100101011001111001000001110001100000100010000101001110 01
0010100111001011011000100111111110110010011001010110011110010000011100011000001000100
0011010000000110101101010111110101000101100001001001010000110011000111101001011101101
0111010001101101111000101010100100011101110011011101011100000010111101111110000111110
0011001010110011110010000011100011000001000100001010011100101101100010011111111011001
0001100110001111010010111011010011010000000110101101010111110101000101100001001001010
1000110100111000111101100010111101011011110010100110110101110011101101100101110100100
0101110011101101100101110100100100011010011100011110110001011110101101111001010011011
0100101101000000001110010011111111010001110101010110000101100110010000011011101110000 0
0111010101011000010110011001000001101110111000000100101101000000001110010011111110100
0010100000111110000110000010101111110111111001101010010101000100110001100111100010000 10
0110110010111010010010001101001110001111011000101111010110111100101001101101011100111
0000001110010011111111010001110101010110000101100110010000011011101110000000100101101 0
0000010101111110111111001101010010101000100110001100111100010000100010100001111110000 11
1000011011011110110010101000010111010000011110011010001111111101111110100110111011100 0
0101010000101110100000111100110100011111111011111010011011101110001000011011011110110
0100101001000110011111001011000000101000100111101010101101010011101101001011110000010
0010100100011001111100101100000010100010011110101010110101001110110100101111000001001
0011100111000010001010111001000000001100001110101100110010011000101101100011010111111 0
0110010101000010111010000011110011010001111111101111110100110111011100010000110110111 1
0010010010100100011001111100101100000010100010011110101010110101001110110100101111000
0001101011111100011100111000010001010111001000000001100001110101100110010011000101101 1
```

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims

What is claimed is:

1. A data processing system, the system comprising:
    an encoder circuit including:
        a cyclic convolution circuit operable to multiply a vector input derived from a user data input by a portion of a circulant matrix to yield a convolved output; and
        an encoded output circuit operable to generate an encoded data set corresponding to the user data input and based at least in part on the convolved output, wherein the encoded output circuit includes:
            a vector adder circuit operable to sum instances of the convolved output with instances of a cyclic convolution output to yield a corresponding instance of a vector sum; and
            a shift register circuit operable to shift instances of the vector sum to yield the instances of the cyclic convolution output.

2. The data processing system of claim 1, wherein the encoded data set generated based at least in part on the cyclic convolution output.

3. The data processing system of claim 1, wherein the number of instances of the vector sum is 1, and wherein 1 corresponds to the number of sub-vectors into which the user data input is divided.

4. The data processing system of claim 1, wherein the cyclic convolution circuit includes:
    a first cyclic convolution circuit; and
    a second cyclic convolution circuit, wherein the first cyclic convolution circuit operates in parallel with the second cyclic convolution circuit, and wherein the first cyclic convolution circuit operates on a first portion of the vector input and the second cyclic convolution circuit operates on a second portion of the vector input.

5. The data processing system of claim 4, wherein the first portion of the vector input is a 3×1 portion of the vector input, and wherein the second portion of the vector input is a 3×4 portion of the vector input.

6. The data processing system of claim 4, wherein the first portion of the vector input is a 3×4 portion of the vector input, and wherein the second portion of the vector input is a 3×8 portion of the vector input.

7. The data processing system of claim 1, wherein the system further comprises:
    a transformation circuit operable to transform a first number of bits of the user data input into a second number of bits of the vector input.

8. The data processing system of claim 7, wherein the first number of bits is 128, and wherein the second number of bits is 255.

9. The data processing system of claim 8, wherein the cyclic convolution circuit includes:
    a first cyclic convolution circuit;
    a second cyclic convolution circuit, wherein the first cyclic convolution circuit operates in parallel with the second cyclic convolution circuit, and wherein the first cyclic convolution circuit operates on a first portion of the vector input to yield a first sub-output and the second cyclic convolution circuit operates on a second portion of the vector input to yield a second sub-output; and
    a combining circuit operable to combine at least the first sub-output and the second sub-output to yield a non-transformed output.

10. The data processing system of claim 1, wherein the system further includes:
    an inverse transformation circuit operable transform the second number of bits of the non-transformed output to the first number of bits of a cyclic convolution output.

11. The data processing system of claim 1, wherein the data processing system is implemented as part of a device selected from a group consisting of: a storage device, and a communication device.

12. The data processing system of claim 1, wherein the data processing system is implemented as part of an integrated circuit.

13. A method for data encoding, the method comprising:
    receiving a user data input;
    using a first cyclic convolution circuit to multiply a first portion of a vector input derived from a user data input by a first portion of a circulant matrix to yield a first convolved output; and
    using a second cyclic convolution circuit in parallel with the first cyclic convolution circuit to multiply a second portion of the vector input by a second portion of a circulant matrix to yield a second convolved output; and
    generating an encoded data set corresponding to the user data input and based at least in part on the first convolved output.

14. The method of claim 13, the method further comprising:
    transforming a first number of bits of the user data input into a second number of bits to yield the vector input.

15. The method of claim 14, wherein the first number of bits is 128, and wherein the second number of bits is 255.

16. The method of claim 13, wherein the first portion of the vector input is a 3×1 portion of the vector input, and wherein the second portion of the vector input is selected from a group consisting of: a 3×4 portion of the vector input, and a 3×8 portion of the vector input.

17. The method of claim 13, wherein the method further comprises:
    adding instances of the convolved output with instances of a cyclic convolution output to yield a corresponding instance of a vector sum; and
    shifting instances of the vector sum to yield the instances of the cyclic convolution output.

18. A data processing system, the system comprising:
    an encoder circuit including:
        a first cyclic convolution circuit operable to multiply a first portion of a vector input derived from a user data input by a portion of a circulant matrix to yield a convolved output;
        a second cyclic convolution circuit, wherein the first cyclic convolution circuit operates in parallel with the second cyclic convolution circuit, and wherein the second cyclic convolution circuit operates on a second portion of the vector input; and an encoded output circuit operable to generate an encoded data set corresponding to the user data input and based at least in part on the convolved output.

19. The data processing system of claim 18, wherein the encoded output circuit comprises:
   a vector adder circuit operable to sum instances of the convolved output with instances of a cyclic convolution output to yield a corresponding instance of a vector sum; and
   a shift register circuit operable to shift instances of the vector sum to yield the instances of the cyclic convolution output.

20. The data processing system of claim 18, wherein the first portion of the vector input is a 3×1 portion of the vector input, and wherein the second portion of the vector input is a 3×4 portion of the vector input.

* * * * *